United States Patent
Carinci et al.

(10) Patent No.: US 10,281,543 B2
(45) Date of Patent: May 7, 2019

(54) MAGNETIC RESONANCE TOMOGRAPHY APPARATUS AND METHOD FOR THE OPERATION THEREOF

(71) Applicant: Siemens Healthcare GmbH, Erlangen (DE)

(72) Inventors: Flavio Carinci, Erlangen (DE); Thorsten Feiweier, Poxdorf (DE); Dominik Paul, Bubenreuth (DE)

(73) Assignee: Siemens Healthcare GmbH, Erlangen (DE)

( * ) Notice: Subject to any disclaimer, the term of this patent is extended or adjusted under 35 U.S.C. 154(b) by 200 days.

(21) Appl. No.: 15/435,616

(22) Filed: Feb. 17, 2017

(65) Prior Publication Data

US 2017/0234953 A1  Aug. 17, 2017

(30) Foreign Application Priority Data

Feb. 17, 2016  (DE) .................. 10 2016 202 400

(51) Int. Cl.
| | | |
|---|---|---|
| G01R 33/48 | (2006.01) | |
| G01R 33/3875 | (2006.01) | |
| G01R 33/54 | (2006.01) | |
| G01R 33/565 | (2006.01) | |
| G01R 33/483 | (2006.01) | |
| G01R 33/56 | (2006.01) | |

(52) U.S. Cl.
CPC ..... *G01R 33/4828* (2013.01); *G01R 33/3875* (2013.01); *G01R 33/4835* (2013.01); *G01R 33/543* (2013.01); *G01R 33/5607* (2013.01); *G01R 33/56563* (2013.01)

(58) Field of Classification Search
CPC ............ G01R 33/4828; G01R 33/3875; G01R 33/543; G01R 33/56563; G01R 33/4835; G01R 33/5607
See application file for complete search history.

(56) References Cited

U.S. PATENT DOCUMENTS

| | | | |
|---|---|---|---|
| 6,628,116 B1 | 9/2003 | Kraft et al. | |
| 8,115,485 B1 | 2/2012 | Maier et al. | |
| 9,791,531 B2 * | 10/2017 | Beck | ............ G01R 33/543 |
| 10,048,339 B2 * | 8/2018 | Feiweier | ............ G01R 33/5607 |
| 2004/0066194 A1 * | 4/2004 | Slade | ............ G01R 33/3808 324/318 |
| 2008/0238421 A1 | 10/2008 | Kitane et al. | |

(Continued)

*Primary Examiner* — Dixomara Vargas
(74) *Attorney, Agent, or Firm* — Schiff Hardin LLP (57) ABSTRACT

In a magnetic resonance tomography scanner and an operating method therefor, a scanning volume is subdivided in a slice direction into multiple scanning slices, and the scan data of each of the scanning slices are acquired by a scan sequence allocated to the respective scanning slice. Each scan sequence has at least one preparation pulse allocated to the scanning slice, which causes nuclear spin excitation throughout the whole scanning volume. At least two scan sequences are implemented that differ with regard to a coil current fed during the preparation pulse to a field correction coil of the scanner for reducing a local inhomogeneity of a basic magnetic field, or that differ with regard to at least one pulse parameter of the preparation pulse. The respective coil current and/or pulse parameter is determined depending on the position of the scanning slice allocated to the respective scan sequence in the scanning volume.

16 Claims, 4 Drawing Sheets

(56) References Cited

U.S. PATENT DOCUMENTS

| | | |
|---|---|---|
| 2010/0286802 A1 | 11/2010 | Feiweier et al. |
| 2014/0200435 A1 | 7/2014 | Edelman et al. |
| 2014/0292333 A1* | 10/2014 | Beck .................... G01R 33/543 |
| | | 324/309 |
| 2015/0268317 A1 | 9/2015 | Blumhagen et al. |
| 2016/0091590 A1 | 3/2016 | Benner et al. |
| 2016/0216350 A1* | 7/2016 | Feiweier ............ G01R 33/5607 |
| 2017/0319097 A1* | 11/2017 | Amthor .................. A61B 5/055 |

* cited by examiner

|   | 1 | 3 | 5 | 2 | 4 | 6 | 8 | 10 | 7 | 9 |
|---|---|---|---|---|---|---|---|----|---|---|
| 1 | X | X | X |   |   |   |   |    |   |   |
| 3 |   | X | X | X |   |   |   |    |   |   |
| 5 |   |   | X | X | X |   |   |    |   |   |
| 2 |   |   |   | X | X | X |   |    |   |   |
| 4 |   |   |   |   | X | X | X |    |   |   |
| 6 |   |   |   |   |   | X | X | X  |   |   |
| 8 |   |   |   |   |   |   | X | X  | X |   |
| 10|   |   |   |   |   |   |   | X  | X | X |
| 7 |   |   |   |   |   |   |   |    | X | X |
| 9 |   |   |   |   |   |   |   |    |   | X |

FIG 6

MAGNETIC RESONANCE TOMOGRAPHY APPARATUS AND METHOD FOR THE OPERATION THEREOF

BACKGROUND OF THE INVENTION

Field of the Invention

The invention concerns a method for operating a magnetic resonance tomography apparatus, in particular the scanner thereof, wherein a scanning volume is subdivided in a slice direction into a number of scanning slices, wherein the scan data of each of the scanning slices are acquired by a scan sequence allocated to the scanning slice, each scan sequence includes at least one preparation pulse allocated to that scanning slice, by which an excitation takes place in the entire scanning volume. The invention also concerns a magnetic resonance tomography apparatus, and a non-transitory, computer-readable data storage medium encoded with programming instructions, for implementing such a method.

Description of the Prior Art

In the context of magnetic resonance tomography, imaging is often desired wherein an image contrast is optimized for particular molecular species. For example, it is usual in the context of medical imaging to reduce the influence of fat tissue on the imaging by various imaging techniques. For this purpose, use is made of the fact that water and fat molecules, in particular CH— and CHO— groups, have slightly different resonance frequencies. The chemical shift is in the region of 3.5 ppm. If, for example, a basic magnetic field of 1.5 T is used, then this corresponds to a frequency shift of 220 Hz.

In order to reduce the image contrast contribution of fat molecules, the short relaxation time of fat molecules can be utilized. For example, with the STIR technique, the fat molecules are excited with a 180° pulse and the scan takes place delayed such that the fat signal is reduced to approximately zero. A disadvantage of this type of scan is that signals from tissue portions that are to be scanned (i.e. for which diagnostic data are desired) are also attenuated.

Other approaches are based on so-called fat saturation, wherein the fat molecules are excited by a radio frequency pulse, for example a 90° pulse, and the existing transverse magnetization is completely dephased by a spoiler gradient. An example of this is the so-called CHESS technique. The approaches described are also combinable, as occurs, for example, in the SPAIR technique. In order to achieve chemical selectivity, an excitation takes place by radiation of a chemically selective preparation pulse in the whole scanning volume. However, such a chemically selective excitation is very sensitive to field inhomogeneities of the basic magnetic field since these detune the resonance frequency of the different molecular species locally.

It is known to determine inhomogeneities in the basic magnetic field in a magnetic resonance scanner so that such inhomogeneities can be compensated locally through a suitable control of field correction coils, also known as shim coils and/or an adaptation of pulse frequencies of an excitation pulse. If, however, larger scanning volumes are to be investigated, it is often not possible to balance inhomogeneities in the entire scan region, so that in the saturation techniques described, no optimum chemical selectivity is achieved. This results in the achievable image quality being lessened.

SUMMARY OF THE INVENTION

An object of the invention is to provide a method for operating a magnetic resonance tomography scanner by which a saturation of the magnetization of particular molecular species is enabled with improved chemical selectivity.

The object is achieved by a method of the aforementioned type but wherein, in accordance with the invention, at least two scan sequences differ with regard to a coil current fed during the preparation pulse to a field correction coil of the magnetic resonance scanner for reducing a local inhomogeneity of the basic magnetic field, and/or differ with regard to at least one pulse parameter of the preparation pulse, wherein the respective coil current and/or pulse parameter is determined depending on the position of the scanning slice allocated to the respective scan sequence in the scanning volume.

In accordance with the invention, during the output of the preparation pulse or during operation of the field correction coils during the emission of the preparation pulse, it is taken into account at which position of the scanning volume the scanning slice is situated, for which a scan data acquisition should take place immediately following the emission of the preparation pulse. The preparation pulse is preferably a chemically selective preparation pulse for lessening signal contributions of at least one molecular species in the scan data, by which molecules of the molecular species are excited in the entire scanning volume. A scanning slice is understood to be an excited subvolume of the scanning volume in the context of the allocated scan sequence. Thicker scanning slices, within which acquisition of scan data that are spatially resolved in the slicing direction, can take place are also designated "slabs". In the method according to the invention, the fact is exploited that the scan data acquisition itself takes place slice-selectively or slab-selectively. The scan sequences are each carried out such that essentially exclusively properties of a defined scanning slice are acquired. For the influence of a particular molecular species on the scan data, for example fat molecules, the extent to which a suppression of this molecular species is achieved, for example by saturation was achieved in the volume of the scanning slice to be acquired, is important. A chemically selective excitation relates to the entire scanning volume. Due to the known position of the scanning slice, however, the chemical selectivity of the preparation pulse can be optimized locally for the respective scanning slice to be examined or for a subvolume of the scanning volume which includes this scanning slice. The scanning volume is preferably a coherent scanning volume.

The use of chemically selective preparation pulses will be described, as an example, for the CHESS technique. Herein, a fat saturation takes place by fat molecules in the scanning volume being excited by a chemically selective preparation pulse with a flip angle of, for example, 90°, thereafter a spoiler gradient (a locally changing magnetic field) is activated so the resulting transverse magnetization is dephased for fat molecules so that the fat molecules do not make a signal contribution in temporally immediately subsequent scans. Due to inhomogeneities in the basic magnetic field, however, the flip angle achieved can vary locally and/or an unwanted excitation of water molecules can take place, so that the image contrast can become reduced for tissue types that are desired to be imaged. By the inventive local optimization of the field correction and/or of the pulse parameters of the preparation pulse, such effects can be minimized.

As noted, it is possible to saturate fat molecules using preparation pulses so that essentially signals of other tissue types remain due to their water contents. Alternatively, it is possible for example, to saturate exclusively water molecules in order to image, for example, fat tissue or silicone.

The acquisition of the scanning volume can take place by, for each of the scanning slices of the scanning volume, precisely one scan sequence being carried out. Through the emission of these scan sequences, the scanning volume can be acquired completely. This acquisition can be repeated in order to obtain a time-resolved image. The use of preparation pulses according to the invention can be combined with any desired scan sequences.

The magnetic resonance tomography scanner is preferably operated such that, before the acquisition of the scan data of a scanning slice, a number of preparation pulses is emitted such that the output is optimized to this scanning slice, as described above. In this manner, an equilibrium state can be achieved in which the decay of the magnetization of the molecular species and the excitation are in balance, so that at the point in time of the scan data acquisition, an essentially temporally constant magnetization is achieved for the molecular species. In the simplest case, the individual scan sequences can each have a number of the preparation pulses. Preferably, however, the sequence of the scan data acquisition for the different scanning slices and the respective subvolumes of the scanning volume considered for determining the coil current and the pulse parameter are selected such that preparation pulses of preceding scan sequences are usable for reaching the equilibrium state for a scanning slice to be acquired in a current scan sequence. For this, different approaches are conceivable, which will now be described.

Each scanning slice can be allocated to at least one subgroup of the scanning slices, composed of multiple scanning slices and is selected such that all the scanning slices of the subgroup lie within a coherent subvolume of the scanning volume. The subvolume extent of the subvolume in the slicing direction is smaller than the scanning volume extent of the scanning volume in the slicing direction. The scan sequences of the respective subgroup are carried out sequentially one after another, with the coil current fed during a preparation pulse to the field correction coil and/or the pulse parameter additionally depending on the position of those scanning slices, which belong to the same subgroup as the scanning slice associated with the respective preparation pulse. The allocated scan sequences are carried out temporally following the respective preparation pulse. For each subgroup, all the scanning sequences allocated to the scanning slices of the respective subgroup can be carried out in an allocated time interval during which exclusively scan sequences of this subgroup are carried out. If a scanning slice is allocated to a number of the subgroups, then the time intervals allocated to the subgroups can overlap. As previously described, it is advantageous for preparation pulses of previously performed scan sequences to have a good chemical selectivity for the scanning slice currently to be scanned, so that they are usable for achieving an equilibrium state. This usability of preparation pulses of preceding scan sequences is improved by the spatial and temporal grouping into subgroups.

The subgroups can be selected such that they each have at least a minimum number of scanning slices, the minimum number being determined depending on the longitudinal relaxation time T1 of the molecular species and/or a repetition time $T_r$ between successive preparation pulses. The variables T1 and $T_r$ can specify how many preparation pulses are required in each case in order to achieve the equilibrium state described above for the magnetization of the molecular species. The minimum number can be calculated, for example, with a time-discrete Bloch simulation of the spin excitation or assuming a fixed flip angle for the individual preparation pulses. It is advantageous for at least for the minimum number of previously output preparation pulses of the coil current of the field correction coil and/or the pulse parameter to be selected such that they are adapted for the scanning slice to be acquired. If such an optimization takes place for the subvolume, that includes all the scanning slices of the subgroup, then for individual scanning slices in the subgroup, the preparation pulses of previously acquired scanning slices can also be used in the same subgroup in order to reach the equilibrium state.

It is possible for each of the scan sequences to have precisely just one preparation pulse. Before the emission of the scan sequence allocated to the first scanning slice of the subgroup, at least one additional preparation pulse can be radiated in order to achieve an equilibrium state even for the scanning slice of the subgroup from which scan data are acquired first.

Each scanning volume can be allocated to exactly one subgroup, the subgroups being selected so that they collectively encompass all the scanning slices of a respective coherent subvolume of the scanning volume. This corresponds to a subdivision of the scanning volume into a number of subvolumes that form parts of the scanning slices differing from one another. The coil current and/or the pulse parameter can be determined depending on the position of the subvolume, which means that they can be selected such that the optimum possible chemical selectivity is reached in the respective subvolume. Within the subgroup, therefore, for each scanning slice in order to reach the equilibrium state, preparation pulses of all the previously performed scan sequences can be utilized for scan sequences of the subgroup. The subvolumes have a smaller extent in the slice direction than the scanning volume, so that the chemical selectivity of the preparation pulses can be improved in relation to a tuning to the whole scanning volume. For example, for all the scanning slices of a subgroup, the same preparation pulse can be emitted and/or the same coil current can be fed to the field correction coil.

In an alternative embodiment of the method according to the invention, the subgroups are selected such that, apart from those scanning slices the allocated scan sequence of which are carried out first and last, each scanning slice belongs to a first subgroup and a second subgroup. The scan sequence allocated to the scan slice is carried out at a pre-determined execution point in time. The first subgroup includes at least one second scanning slice, the allocated second scan sequence of which is carried out before the pre-set execution point in time. The second subgroup includes at least one third scanning slice, the allocated third scan sequence of which is carried out after the pre-determined execution time point. Each scanning slice can also belong to further subgroups. Through its belonging to multiple subgroups with the properties described, for the acquisition of the scanning volume, a coherent chain of subgroups is formed, each overlapping with the preceding and subsequent group. The coil current and/or the pulse parameter can be determined respectively for the preparation pulse of a scan sequence so that the chemical selectivity of the preparation pulse is optimized for the subvolume of that subgroup in which the current scan sequence forms the temporally first executed scan sequence. This means that, for the scanning slice for which the scan sequence is temporally last executed in a subgroup, as many preparation pulses have already been emitted, the chemical selectivity of which is optimized in relation to the respective scanning slice as the subgroup contains scanning slices.

The smaller the subvolume extent of the subvolume is in the slicing direction, the better a chemical selectivity of the preparation pulse can be jointly optimized for all the scanning slices of the subgroup. It is therefore advantageous to minimize the subvolume extent. Therefore an allocation of the scanning slices to the subgroups can be determined in that a minimizing variable is minimized which for the respective allocation defines the subvolume extent of that subgroup in the slicing direction, the subvolume extent of which is greater than or equal to the subvolume extent of all the other subgroups. It is hereby achieved that the maximum subvolume extent of the subgroups is minimal. The optimization can take place under the framework conditions given above and described below.

The temporal order of the scan sequence can be selected such that with temporally directly sequential scan sequences, scan data is always acquired from scanning slices between which at least one other of the scanning slices lies. In order to enable a rapid scanning by the magnetic resonance tomography scanner, following the scanning of the scan data of a scanning slice, there should be no waiting until all the excited nuclear spins have decayed to the equilibrium state. If, directly thereafter, an adjacent scanning slice is scanned, then the excitation for scanning of the preceding scanning slice could exert an influence on this subsequent scan. It is therefore advantageous to scan, temporally sequentially, scanning slices which are spaced apart from one another.

Apart from the scan sequence performed first temporally, each of the scan sequences can comprise exactly one preparation pulse. As described above, it is possible also to use preparation pulses from previously performed scan sequences to achieve an equilibrium state for subsequent scans if these are selected so that they are also optimized for scanning slices the scan sequence of which is subsequently performed. Through the use of only one preparation pulse per scan sequence, a scanning time can be reduced.

The at least one pulse parameter can be a pulse frequency and/or a spectral composition and/or a pulse amplitude of the preparation pulse and/or a relative transmission amplitude for different antennae by which the preparation pulse is emitted. The pulse frequency defines the frequency at which the spectral distribution of the preparation pulse has its maximum. Through an adaptation of the spectral composition and/or the pulse frequency, in particular, detuning of the resonance frequency of the molecular species to be excited, due to inhomogeneities of the main magnetic field, can be corrected. Apart from inhomogeneities in the basic magnetic field, however, it is also possible that the radio frequency field that is used to emit the preparation pulse is not homogeneous in the scanning volume. It is therefore possible, depending on the position of the scanning slice, to adapt a pulse amplitude, for example in order to achieve a pre-determined flip angle of the preparation pulse or to adapt relative transmission amplitudes for different antennae in order to optimize a spatial distribution of the field strength to the respective scanning slice to be acquired.

Apart from the method according to the invention, the invention concerns a magnetic resonance tomography apparatus configured to carry out the method according to the invention. The magnetic resonance tomography apparatus has a scanner operated by a control computer that is configured, in the context of the scan data acquisition to control a radio frequency excitation device having at least one antenna for radiating radio frequency pulses into an examination volume and at least one gradient coil for generating gradient fields. In addition, the magnetic resonance tomography scanner has an acquisition apparatus for receiving radio-frequency electromagnetic fields emitted by nuclear spins of an examination object. The control computer is configured to process the acquired electromagnetic fields in order to provide scan data, in particular image data. The basic manner of operation of a magnetic resonance tomography apparatus is known to those skilled in the art, and thus need not be described in more detail herein.

The magnetic resonance tomography scanner has a field correction coil for reducing a local inhomogeneity of the basic magnetic field in the scanning volume. The control computer is configured to determine the coil current fed to the field correction coil and/or a pulse parameter of a preparation pulse for a scan sequence, in order to reduce signal portions of at least one molecular species depending on a position of a scanning slice, the scan data of which are acquired in a respective scan sequence.

The present invention also encompasses a non-transitory, computer-readable data storage medium encoded with programming instructions that, when the storage medium is loaded into a computer system of a magnetic resonance apparatus, cause the computer to operate the apparatus in accordance with any or all of the above-described embodiments of the method according to the invention.

DESCRIPTION OF THE PREFERRED EMBODIMENTS

Figure 1:
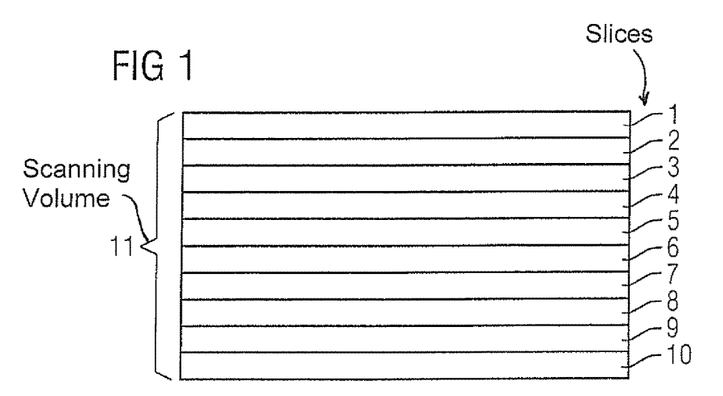
FIG. 1 illustrates a scanning volume, from which magnetic resonance scan data are to be acquired.

FIG. 1 shows a coherent (gap-free) scanning volume 11 which is subdivided into a number of scanning slices 1-10. Each of these scanning slices 1-10 is to be acquired by a scan sequence which includes a respective chemically selective preparation pulse for lessening signal contributions of at least one molecular species, for example of fat tissue in the scan data. The radiation of the preparation pulses takes place by the molecular species being excited in the overall scanning volume. Since, however, in magnetic resonance scanners, the basic magnetic field and the radio frequency field produced by the radiation of excitation pulses, are not perfectly homogeneous, this leads to locally different levels of suppression of the signal component of the molecular species.

This problem is solved by, in the context of the individual scan sequences, a coil current fed to a field correction coil in order to reduce a local inhomogeneity of the basic magnetic field and/or at least one pulse parameter of the preparation pulse is determined depending on the position of the scanning slice 1-10 allocated to the respective scan sequence. In the simplest case, for this purpose, the current coil and/or the pulse parameter for each of the scan slices 1-10 could be pre-set separately such that the chemical selectivity of the preparation pulse is optimized for precisely this scanning slice 1-10. An optimization can take place according to the known method for optimizing a chemical selectivity in a scanning volume with a known field inhomogeneity.

A disadvantage of such a separate optimization, however, is that in order to reach an equilibrium state of the magnetization of the molecular species, a minimum number of preparation pulses can be necessary, which depends on a longitudinal relaxation time $T1$ of the molecular species and/or on a repetition time $T_r$ between successive preparation pulses. Therefore, before the acquisition of scan data for a scanning slice 1-10, a pre-set number of preparation pulses, the chemical selectivity of which is optimized for a subvolume which includes this scanning slice, is emitted. If the chemical selectivity were optimized for each one of the scanning slices 1-10, each of the scan sequences would then have to include a minimum number of preparation pulses, which would lead to an increase in the scan time.

In order to prevent such an extension of the scan time, a number of subgroups of the scanning slices 1-10 are selected, the optimization of the chemical selectivity of the preparation pulse taking place by selection of a corresponding coil current and/or a pulse parameter for respective subvolumes that encompass the volumes of all the scanning slices 1-10 of the respective subgroup. An example of a subgroup formation of this type is shown in the table in FIG. 2. The numbers used as labels for the columns and rows each correspond to one of the scanning slices 1-10 shown in FIG. 1. The sequence of numbers is selected so that it corresponds to the temporal sequence of the scan data acquisition for the scanning slices 1-10. The scan data of the scanning slices are therefore acquired in the sequence 1, 3, 5, 2, 4, 6, 8, 10, 7, 9. The columns marked with an "X" indicate for each row, that is, for each scanning slice 1-10, which of the scanning slices 1-10 are taken into account, respectively, in the optimization of the chemical selectivity of the preparation pulse.

Figure 2:
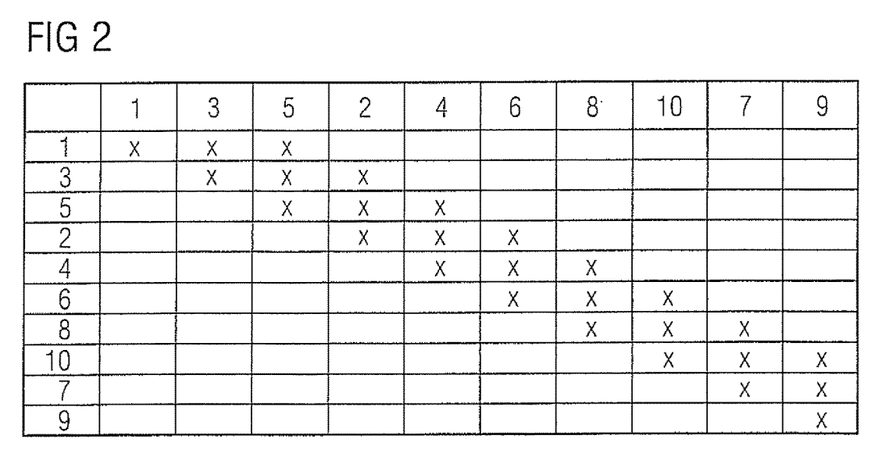
FIG. 2 is a table showing the temporal sequence of the scanning of the scanning slices in FIG. 1 and their grouping into subgroups, in an exemplary embodiment of the method according to the invention.

In the example shown, the minimum number of preparation pulses for achieving an equilibrium state is three. It is also to be achieved that apart from the scan sequence performed first temporally, each of the scan sequences comprises exactly one preparation pulse. In order to determine the coil current and/or the pulse parameter, therefore, apart from the current scanning slice 1-10, the two scanning slices 1-10 acquired temporally subsequently thereto are thus taken into account. The three preparation pulses which are required before the scanning of scanning slice 5 are provided, for example, by means of the preparation pulses which are emitted for the scanning slices 1, 3, 5.

The "X" markings in each row therefore identify the columns of those scanning slices 1-10 that are allocated to a respective subgroup. These scanning slices each all lie in one of the subvolumes of the scanning volume allocated to the subgroup, wherein the subvolume extent in the slicing direction is smaller than the scanning volume extent in the slicing direction. For example, the subgroup allocated to the first row comprises a subvolume which extends from the scanning slice 1 to the scanning slice 5 and the subgroup allocated to the second line comprises a subvolume which extends from the scanning slice 2 to the scanning slice 5. The chemical selectivity of the preparation pulse is optimized for this subvolume wherein the optimization takes place through a suitable selection of the coil current and/or the pulse parameter.

The emission of the scan sequences takes place sequentially one after another according to a pre-set sequence that is given by the row and column headings. The optimization of the chemical selectivity, that is, the adaptation of the coil current and/or the pulse parameter takes place in each case additionally depending on the position of those scanning slices which at least belong to one common subgroup and the allocated scan sequences of which are carried out temporally sequentially. For example, the parameterization during the preparation pulse played out for the first scanning slice 1, as shown in row 1, also depends on the positions of the scanning slices 3 and 5 which belong to the same subgroup and the allocated scan sequences of which are subsequently carried out.

The subgroups are selected such that they each overlap by two scanning slices. For example, the first subgroup comprises the scanning slices 1, 3, 5 and the second subgroup comprises the scanning slices 3, 5, 2. This gives not only the preparation pulse that is emitted for the current scanning slice 1-10 for the respective scanning slice a good chemical selectivity, but also the two preceding preparation pulses emitted for other scanning slices. Since, however, the selected subgroups are in coherent subvolumes which have a smaller dimension than the scanning volume, an improvement of the chemical selectivity compared with a matching to the overall scanning volume can nevertheless be achieved.

A grouping of the scanning slices and a determination of the corresponding scanning row sequence, as shown in FIG. 2, can be determined in that the allocation of the scanning slices to the subgroups is varied and a minimizing variable is minimized which for the respective allocation defines the subvolume extent in the slicing direction of that subgroup, the subvolume extent of which is a maximum in the respective allocation.

Figure 3:
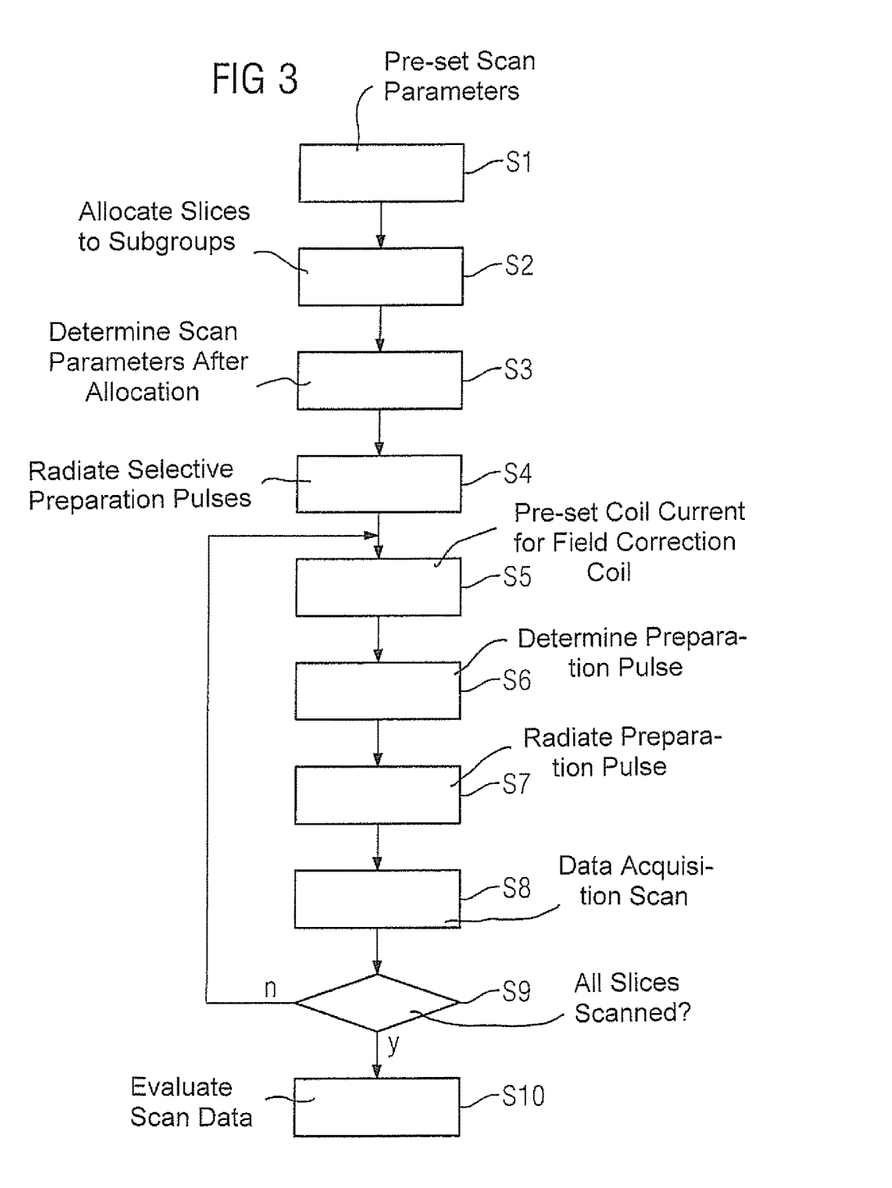
FIG. 3 is a flowchart of an exemplary embodiment of the method according to the invention.

FIG. 3 shows a method for operating a magnetic resonance tomograph wherein in order to suppress signal contributions of at least one molecular species, preparation pulses are used, as described in relation to FIGS. 1 and 2. For this purpose, in step S1, scan parameters which define a scan to be carried out by the magnetic resonance tomograph wherein a signal of a molecular species, in particular a fat signal, is to be suppressed are pre-set by a user. The scan parameters define the scanning volume. They can also define a subdivision of the scanning volume into scanning slices, wherein a distribution into any desired number of scanning slices is possible. Alternatively, a distribution into scanning slices can be determined automatically by a control apparatus of the magnetic resonance tomograph. As a scanning parameter, one of various scan types can also be pre-set, for example, whether a $T1$ or $T2$-weighted scan should be carried out or whether a functional imaging should take place.

In step S2, as described in relation to FIG. 1 and FIG. 2, each of the scanning slices is allocated to at least one subgroup so that, first, a sequence is defined in which the scan sequences allocated to the scanning slices will be carried out and, second, the positions in which scanning slices will be called upon to determine the coil current or the pulse parameter is defined. The corresponding parameters are determined in step S3. As the pulse parameter, a pulse frequency, that is a maximum of a spectral distribution of the preparation pulse, a pulse amplitude and/or a relative transmission amplitude for different antennae by means of which the preparation pulse is emitted can be determined. A determination of corresponding parameters for a defined scanning volume is known from the prior art. The determination in the method described takes place in the same way, although in place of the overall scanning volume, a coherent subvolume is taken into account which comprises the previously determined scanning slices.

In order to transfer the magnetization of the selected molecular species for the first scanning slice scanned into an equilibrium state, in step S4, a number of chemically selective preparation pulses are radiated. Preferably, these preparation pulses and a coil current fed to the field correction coil are identical to the preparation pulse or the coil current which are used for the preparation pulse emitted in the context of the scan of the first scanning slice.

In steps S5 to S9, the scan sequences are played out for the individual scanning slices. For this purpose, in step S5, the coil current determined for the respective scanning slice for the field correction coil is pre-set, in step S6, depending on the previously determined pulse parameters, a preparation pulse is determined and in step S7, this preparation pulse is radiated in. Optionally, in step S7, a spoiler gradient can be switched in order to dephase a transverse magnetization of the excited molecular species. In step S8, a scan data acquisition with a further scan sequence dependent on one of the selected scanning methods takes place. In step S9, it is subsequently checked whether a scan data acquisition has taken place for the scanning slices. If this is not the case, then the method is repeated from step S5 onward. Otherwise, the method is continued at step S10 in which the scan data are evaluated, that is for example, a reconstruction image is generated and provided for a user or the like.

The determination of the subgroups described in relation to FIGS. 1 and 2 by solving an optimization problem can be computation-intensive for large numbers of slices. In an alternative embodiment of the method, it is possible that each scanning slice is allocated to exactly one subgroup wherein the subgroups are selected such that they comprise all the scanning slices of a respective coherent subvolume of the scanning volume. Examples of this are shown in FIGS. 4 and 5.

Figure 4:
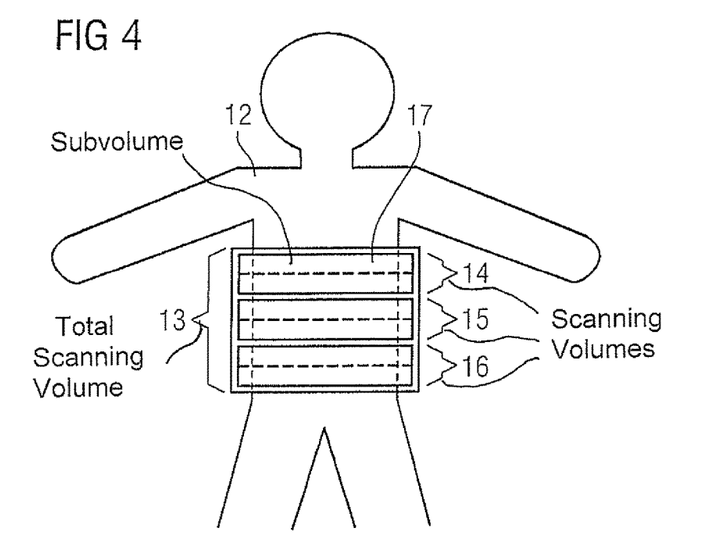
FIGS. 4 and 5 show examples for the division of the scanning slices into subgroups in further exemplary embodiments of the method according to the invention.

FIG. 4 shows the recording of scan data of an examination object 12 in the examination volume 13. The scan data acquisition is herein carried out in three breath-holding cycles in which the examination object 12 holds their breath. In the first breath-holding cycle, the scanning volume 14 is acquired and in the second, the scanning volume 15 and in the third, the scanning volume 16. In order to improve the chemical selectivity of the preparation pulses despite possible inhomogeneities in the magnetic field of the magnetic resonance tomograph, the scanning volumes 14-16 are each subdivided into two subvolumes 17. The coil current and/or the pulse parameter are herein each determined depending on the position and the extent of the respective subvolume 17. The subvolumes 17 each include a subgroup of the scanning slices (not shown). For all the scanning slices of one of the subgroups, the same preparation pulse can be output and the same coil current can be fed to the field correction coil.

Alternatively, the scan described in relation to FIG. 4 could also be carried out such that no subvolumes 17 are defined, but for all the scanning slices in a respective scanning volume 14-16 acquired in a breath-holding cycle, the same preparation pulse is output and the same coil current is fed to the field correction coil. The coil current and/or the pulse parameter are herein each determined depending on the position and the extent of the respective scanning volume 14-16. The scanning volumes 14-16 thus form subvolumes of the examination volume 13. The scanning volumes 14-16 each comprise a subgroup of the scanning slices (not shown).

Figure 5:
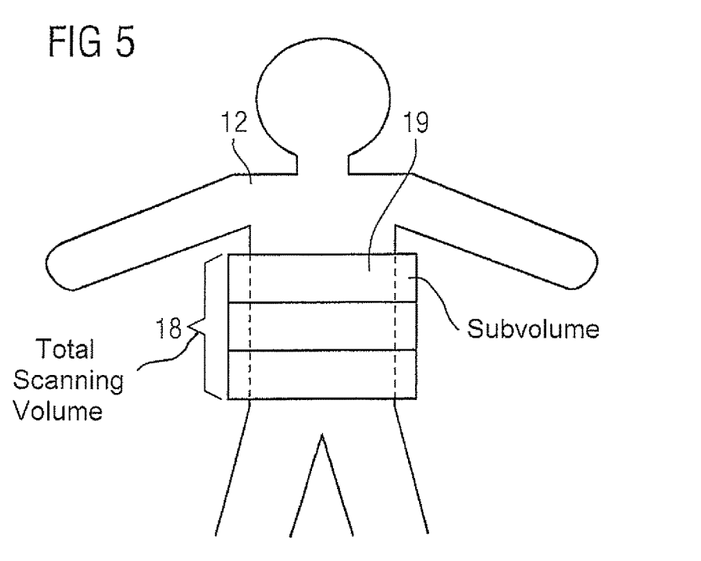

FIG. 5 shows a scan in the scanning volume 18 of the examination object 12 wherein the overall scan is carried out in a single breath holding cycle. Since the scanning volume 18 is larger than the scanning volumes 14-16, in this case, a subdivision takes place into three subvolumes 19 which each comprise subgroups of the scanning slices (not shown). In the exemplary embodiment according to FIG. 5, therefore, three different preparation pulses or coil currents for the three different subvolumes 19 are used.

Figure 6:
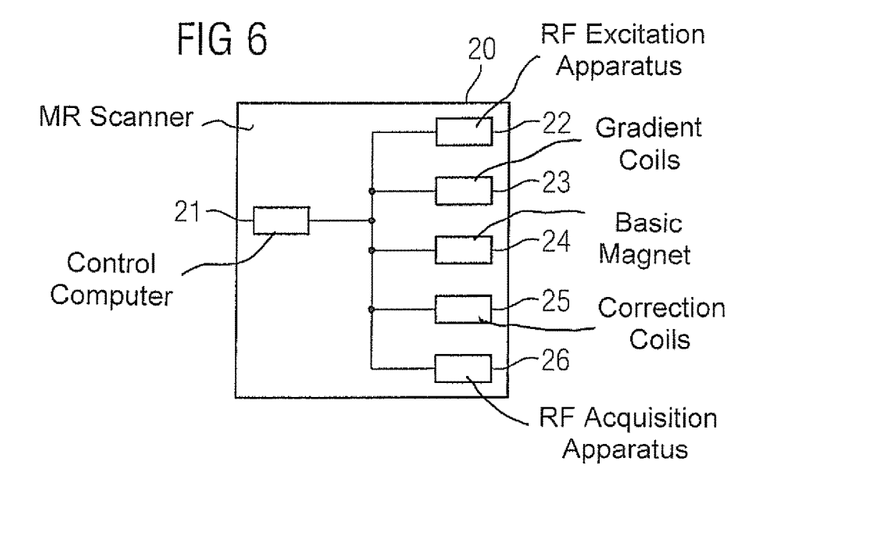
FIG. 6 is a basic block diagram of a magnetic resonance tomograph according to the invention.

FIG. 6 shows schematically a magnetic resonance scanner 20. Only the basic functional components are shown. For clarity, the geometrical arrangement of the individual components is not shown. The magnetic resonance scanner 20 has a control computer 21 that controls the further components of the magnetic resonance scanner 20 to carry out the previously described method. This control computer 21 controls a radio frequency excitation apparatus 22 to radiate in the preparation pulses and further excitation pulses for the scanning operation in the scanning volume. In order to enable a slice-selective excitation in the scanning volume or the switching of spoiler gradients, the magnetic resonance scanner 20 also has gradient coils 23. The basic magnetic field of the magnetic resonance scanner 20 is produced by a basic magnet 24. Inhomogeneities in the basic magnetic field can be corrected by passing currents through correction coils 25. The control computer 21 provides suitable coil currents for the field correction coils 25. Data acquisition is possible via the acquisition apparatus 26 which acquires radio frequency radiation emitted by an examination object, converts it and provides it to the control computer 21 for further processing.

The method described can exist in the form of programming instructions encoded on an electronically readable data carrier (not shown) with electronically readable control information (code) stored thereon. The control information causes the control computer 21 to operate the magnetic resonance scanner 20 in order to carry out the inventive method as described.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance scanner comprising a basic field magnet that emits a basic magnetic field, said method comprising:

in a control computer, subdividing a slice direction in said scanner into a plurality of scanning slices and acquiring scan data from each of said scanning slices by executing a scan sequence allocated to the respective scanning slice;

operating said scanner from said computer to, in each scan sequence, activate at least one preparation pulse allocated to the respective scanning slice that excites nuclear spins in an entirety of said scanning volume;

in each of said scan sequences, including at least one measure that mitigates effects of inhomogeneities in said basic magnetic field;

in said control computer, making at least two of said scan sequence differ from each other with regard to said measure, depending on a position of the respective scanning slice in the scanning volume allocated to the respective scan sequence among the differing scan sequences; and in said computer, generating a data file comprising said scan data, and making the data file available from the computer in electronic form as an output.

2. A method as claimed in claim 1 wherein said magnetic resonance scanner comprises a field correction coil fed with a coil current in order to generate a correction field that corrects said inhomogeneities in said basic magnetic field, and wherein said at least one measure to mitigate the effects of inhomogeneities in said basic magnetic field comprises at least one of adapting said coil current fed to said correction coil during a preparation pulse in the respective scan sequence for a respective scanning slice, and adapting at least one pulse parameter of said preparation pulse, with said coil current or said pulse parameter being determined dependent on said position of the respective scanning slice in the scanning volume allocated to the respective scan sequence among said differing scan sequences.

3. A method as claimed in claim 1 comprising:
in said computer, allocating each scanning slice to at least one subgroup consisting of a plurality of scanning slices forming a coherent subvolume that has a subvolume extent in said slice direction that is smaller than an extent of the entire scanning volume in said slice direction; and
from said computer, causing said scan sequences of the scanning slices in each subgroup to be implemented sequentially, with said measure additionally depending on a position of the respective scanning slice within the respective subgroup.

4. A method as claimed in claim 3 comprising selecting each subgroup to consist of a minimum number of said scanning slices, said minimum number being dependent on at least one of a longitudinal relaxation time T1 of the molecular species being excited, and a repetition time $T_r$ between successive preparation pulses.

5. A method as claimed in claim 3 comprising allocating each scanning slice to only one respective subgroup, and selecting a plurality of subgroups so as to collectively include all of the scanning slices within a coherent subvolume of the scanning volume.

6. A method as claimed in claim 3 comprising, for all scanning slices in each subgroup, emitting the same preparation pulse.

7. A method as claimed in claim 3 wherein said at least one measure to mitigate the effects of inhomogeneities in said basic magnetic field comprises adapting said coil current fed to said correction coil during a preparation pulse in the respective scan sequence for a respective scanning slice dependent on said position of the respective scanning slice in the scanning volume allocated to the respective scan sequence among said differing scan sequences, and comprising for all of the scanning slices in each subgroup, feeding the same coil current to the field correction coil during said at least one preparation pulse.

8. A method as claimed in claim 3 wherein said scanning volume comprises a first scanning slice for which the allocated scan sequence is executed first, and a last scanning slice for which the allocated scan sequence is implemented last, and wherein said method comprises selecting said subgroups so that each scanning slice, other than said first slice and said last slice, belongs to a first subgroup and a second subgroup, said first subgroup comprising at least one scanning slice for which the allocated scan sequence is implemented before a predetermined execution point in time, and wherein said second subgroup comprises at least one scanning slice for which the allocated scan sequence is implemented after said predetermined execution point in time.

9. A method as claimed in claim 3 comprising allocating said scanning slices to respective subgroups by minimizing a minimizing variable for which the respective allocation defines an extent of the subvolume of the respective subgroup in the slice direction, said subvolume extent being greater than or equal to the subvolume extent of all other subgroups.

10. A method as claimed in claim 1 comprising executing said scan sequences in a temporal order that causes scan data to always be acquired from respective scanning slices between which spatially at least one other scanning slice is present.

11. A method as claimed in claim 1 comprising, except for a first-implemented scan sequence among the respective scan sequences, each of said scan sequences comprising exactly one preparation pulse.

12. A method as claimed in claim 1 wherein said at least one measure to mitigate the effects of inhomogeneities in said basic magnetic field comprises adapting at least one pulse parameter of said preparation pulse dependent on said position of the respective scanning slice in the scanning volume allocated to the respective scan sequence among said differing scan sequences, and comprising selecting said at least one pulse parameter from the group consisting of a pulse frequency of the preparation pulse, a spectral composition of the preparation pulse, a pulse amplitude of the preparation pulse, and a relative transmission amplitude for different radiators in the scanner from which the preparation pulse is emitted.

13. A magnetic resonance apparatus comprising:
a magnetic resonance data acquisition scanner;
a control computer configured to subdivide a slice direction in said scanner into a plurality of scanning slices and acquiring scan data from each of said scanning slices by executing a scan sequence allocated to the respective scanning slice;
said control computer being configured to operate said scanner, in each scan sequence, to activate at least one preparation pulse allocated to the respective scanning slice that excites nuclear spins in an entirety of said scanning volume;
said control computer being configured to include, in each of said scan sequences, at least one measure that mitigates effects of inhomogeneities in said basic magnetic field;
said control computer being configured to make at least two of said scan sequences differ from each other with regard to said measure, depending on a position of the respective scanning slice in the scanning volume allocated to the respective scan sequence among the differing scan sequences; and
said computer being configured to generate a data file comprising said scan data, and to make the data file available from the computer in electronic form as an output.

14. A magnetic resonance apparatus as claimed in claim 13 wherein said magnetic resonance scanner comprises a field correction coil fed with a coil current in order to generate a correction field that corrects said inhomogeneities in said basic magnetic field, and wherein said at least one measure to mitigate the effects of inhomogeneities in said basic magnetic field comprises at least one of said processor adapting said coil current fed to said correction coil during a preparation pulse in the respective scan sequence for a respective scanning slice, and said processor adapting at least one pulse parameter of said preparation pulse, with said coil current or said pulse parameter being determined dependent on said position of the respective scanning slice in the scanning volume allocated to the respective scan sequence among said differing scan sequences.

15. A non-transitory, computer-readable data storage medium encoded with programming instructions, said storage medium being loaded into a computer system of a magnetic resonance apparatus that comprises a magnetic resonance data acquisition scanner, said programming instructions causing said computer system to:

subdivide a slice direction in said scanner into a plurality of scanning slices and acquiring scan data from each of said scanning slices by executing a scan sequence allocated to the respective scanning slice;

operate said scanner, in each scan sequence, to activate at least one preparation pulse allocated to the respective scanning slice that excites nuclear spins in an entirety of said scanning volume;

in each of said scan sequences, include at least one measure that mitigates effects of inhomogeneities in said basic magnetic field;

make at least two of said scan sequences differ from each other with regard to said measure, depending on a position of the respective scanning slice in the scanning volume allocated to the respective scan sequence among the differing scan sequences; and generate a data file comprising said scan data, and make the data file available from the computer in electronic form as an output.

16. A storage medium method as claimed in claim 15 wherein said magnetic resonance scanner comprises a field correction coil fed with a coil current in order to generate a correction field that corrects said inhomogeneities in said basic magnetic field, and wherein said programming instructions cause said computer system to produce said at least one measure to mitigate the effects of inhomogeneities in said basic magnetic field by at least one of adapting said coil current fed to said correction coil during a preparation pulse in the respective scan sequence for a respective scanning slice, and adapting at least one pulse parameter of said preparation pulse, with said coil current or said pulse parameter being determined dependent on said position of the respective scanning slice in the scanning volume allocated to the respective scan sequence among said differing scan sequences.

* * * * *